(12) United States Patent
Lau

(10) Patent No.: US 7,406,642 B1
(45) Date of Patent: Jul. 29, 2008

(54) TECHNIQUES FOR CAPTURING SIGNALS AT OUTPUT PINS IN A PROGRAMMABLE LOGIC INTEGRATED CIRCUIT

(75) Inventor: Ker Yon Lau, Penang (MY)

(73) Assignee: Altera Corporation, San Jose, CA (US)

( * ) Notice: Subject to any disclaimer, the term of this patent is extended or adjusted under 35 U.S.C. 154(b) by 47 days.

(21) Appl. No.: 11/242,437

(22) Filed: Oct. 3, 2005

(51) Int. Cl.
*G01R 31/28* (2006.01)

(52) U.S. Cl. ........................................ 714/727; 714/734
(58) Field of Classification Search ........................ None
See application file for complete search history.

(56) References Cited

U.S. PATENT DOCUMENTS

| | | | | |
|---|---|---|---|---|
| 5,764,076 A | * | 6/1998 | Lee et al. ........................ 326/38 |
| 5,852,617 A | * | 12/1998 | Mote, Jr. ....................... 714/726 |
| 6,163,188 A | * | 12/2000 | Yu ................................. 327/199 |
| 6,266,793 B1 | * | 7/2001 | Mozdzen et al. ............. 714/727 |
| 6,285,211 B1 | * | 9/2001 | Sample et al. ................. 326/41 |
| 6,681,378 B2 | * | 1/2004 | Wang et al. .................... 716/17 |
| 2002/0157078 A1 | * | 10/2002 | Wang et al. .................... 716/17 |
| 2005/0073788 A1 | * | 4/2005 | Weinraub ..................... 361/100 |
| 2005/0166109 A1 | * | 7/2005 | Dubey .......................... 714/726 |
| 2006/0156113 A1 | * | 7/2006 | Whetsel ....................... 714/724 |

* cited by examiner

*Primary Examiner*—Jacques Louis-Jacques
*Assistant Examiner*—Guerrier Merant
(74) *Attorney, Agent, or Firm*—Steven J. Cahill

(57) ABSTRACT

Techniques are provided for capturing external signals at output pins on a programmable logic integrated circuit (IC) during a boundary scan test. A JTAG sample signal is routed to an input/output block on a chip and active during a JTAG sampling phase. An input buffer coupled to an output pin is turned on during the JTAG sample phase. Logic gates enable the input buffer in response to the JTAG sample signal so that the input buffer can capture a signal on the pin. The input buffer is turned off after the JTAG sampling phase to conserve power. The output buffer coupled to the pin that receives the test signal is tristated to prevent contention during the JTAG sampling phase. The techniques of the present invention can be used to test board level interconnects in less time and are easy to implement.

20 Claims, 3 Drawing Sheets

TECHNIQUES FOR CAPTURING SIGNALS AT OUTPUT PINS IN A PROGRAMMABLE LOGIC INTEGRATED CIRCUIT

BACKGROUND OF THE INVENTION

1. Field of the Invention

The present invention relates to programmable logic integrated circuits, and more particularly, to techniques for capturing signals at output pins in a programmable logic integrated circuit.

2. Description of Related Art

Often referred to as the JTAG standard after the Joint Test Action Group that developed it, the JTAG standard provides boundary-scan testing and debugging of printed circuit boards (PCBs) and systems to solve physical access problems on PCBs caused by crowded assemblies. The JTAG standard also provides in-system programming (ISP) of flash memory and field programmable gate arrays (FPGAs).

Boundary scan is a methodology that allows the control and observation of the boundary pins of a JTAG compatible device via software control. Boundary scan provides in-circuit testing without in-circuit test equipment. Boundary-scan testing embeds test circuitry at the chip level to form a complete board-level test protocol.

A digital system on a board includes two or more integrated circuit chips connected together through board level interconnect lines. The interconnect lines can be tested to ensure that they are working properly using a JTAG sample instruction. According to the JTAG sample instruction, the board level interconnect lines are tested by scanning in a "0/1" test signal at a first one of the integrated circuit chips, transmitting the signal across the interconnect lines, and then sampling the test signal at one or more receiving chips on the same board.

Each of the receiving chips receives the test signal at a pin and transmits the signal to a boundary scan register through an input buffer. If one of the receiving chips does not capture the correct test signal value, the interconnect lines are not functioning properly, possibly because of an open circuit or short circuit on one of the interconnect lines. The JTAG sample instruction is not dependent on the type of input/output (IO) standard used at the IO pins of the receiving chip.

In a typical FPGA, an input buffer and an output buffer is coupled to each input/output (IO) pin. The IO pins can be programmed to function exclusively as input pins, exclusively as output pins, or as bidirectional pins during user mode. Thus, there are input buffers coupled to pins that are programmed to be used exclusively as output pins. These input buffers are not used during the user mode. Therefore, in the Stratix® II and Cyclone™ II FPGAs made by Altera Corporation of San Jose, Calif., these unused input buffers are turned off to save IO power. Because the input buffers for the programmed output pins are turned off, the receiving chip cannot capture interconnect test signals applied to the output pins during the JTAG test phase. As a result, the JTAG sample instruction fails.

Turning off the unused input buffers to save power causes a conflict between the driver and the receiver chips during the board level interconnect test, because the receiver is not able to capture the signal sent from the driver. This conflict makes it difficult to test the integrity of the board level interconnect. It may still be possible to test the board level interconnect, but such techniques typically increase the complexity and test time. It would therefore be desirable to provide efficient techniques for capturing board level signals on programmable logic integrated circuits during boundary scan that minimize power consumption.

BRIEF SUMMARY OF THE INVENTION

The present invention provides techniques for capturing external signals at output pins on a programmable logic integrated circuit (IC) during a boundary scan test. During a JTAG sampling phase, a JTAG sample signal is routed to an input/output (IO) block containing an output pin on an programmable logic IC. Logic gates in the IO block cause an input buffer coupled to the output pin to turn on in response to the JTAG sample signal.

The logic gates enable the input buffer so that the input buffer can capture a test signal at the output pin. The output buffer coupled to the pin that receives the test signal is tristated to prevent contention during the JTAG sampling phase. The input buffer is subsequently turned off to conserve power, because the pin is programmed to function as an output pin in user mode. The techniques of the present invention can be used to test board level interconnects in less time and are easy to implement.

Other objects, features, and advantages of the present invention will become apparent upon consideration of the following detailed description and the accompanying drawings, in which like reference designations represent like features throughout the figures.

DETAILED DESCRIPTION OF THE INVENTION

Figure 1:
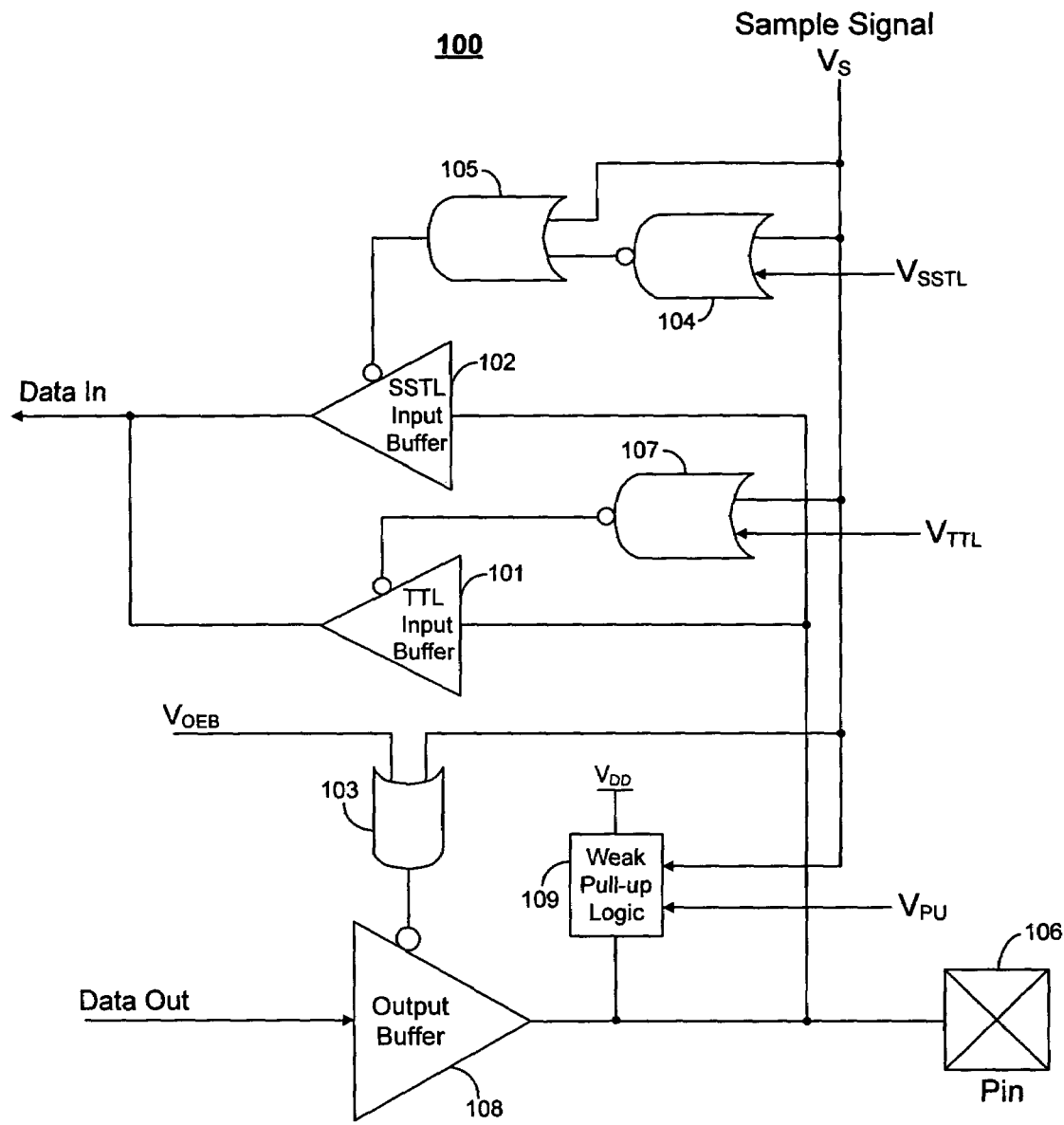
FIG. 1 is an illustration of a input/output block that can capture an external signal during a JTAG sampling phase according to an embodiment of the present invention.

FIG. 1 illustrates a portion 100 of an input/output (IO) block on a programmable logic integrated circuit chip, such as a field programmable gate array (FPGA), a programmable logic device, or a mask FPGA/PLD.

IO portion 100 of the chip is designed to receive a signal at pin 106 that is used to test external resources such as board level interconnects according to an embodiment of the present invention. The present invention can be used to test a variety of interconnections. For example, IO portion 100 can receive a signal that indicates the operability of a board level interconnect line that routes signals between two IC chips.

Board level interconnects are tested during a JTAG sampling phase of a boundary scan according to the IEEE JTAG 1149.1 standard. During the JTAG sampling phase, a signal is driven to a receiving chip to test the operability of the board level interconnect. A JTAG sample signal $V_S$ is high during the JTAG sampling phase. Pin 106 is programmed to function as an output pin by configuration data (CRAM). Therefore, the input buffers in IO block 100 are normally disabled to conserve power, because pin 106 is configured to function only as an output pin.

According to the present invention, logic circuits in IO buffer 100 enable an input buffer 101 in response to a JTAG sample signal during the JTAG sampling phase to capture a signal at pin 106, as will be described in further detail below.

Testing board level interconnects is merely one example of the present invention. It should be understood that the techniques of the present invention can be applied to receiving other types of external signals.

Figure 2:
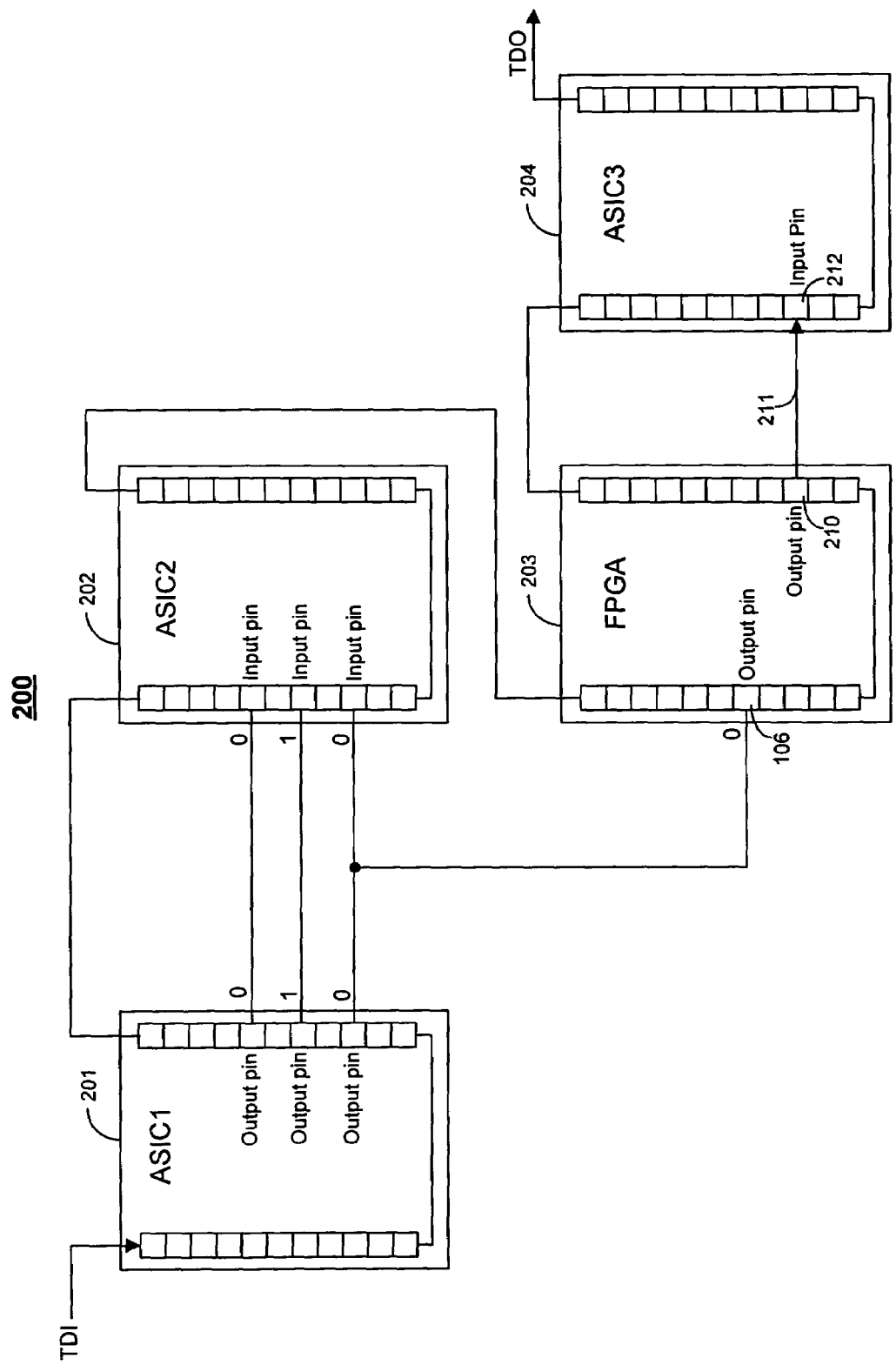
FIG. 2 is a board level diagram of a digital system with integrated circuit chips that are configured to perform a boundary scan and board level tests according to an embodiment of the present invention.

FIG. 2 illustrates an example of a system 200 on a board that includes three integrated circuit (IC) chips. System 200 includes ASIC 201, ASIC 202, FPGA 203, and ASIC 204. Three ASICs and one FPGA are used merely as an example in FIG. 2. Alternatively, FPGA 203 can be a mask field programmable gate array (MFPGA).

Each chip in system 200 uses several input and output pins during boundary scan, including output pin 106 on FPGA 203. Each of the three chips in system 200 is compliant with the IEEE 1149.1 JTAG standard. All three chips are coupled together via the board level interconnect lines to form a scan chain as illustrated in FIG. 2.

During the boundary scan, input signals are captured for analysis and output signals are preset to test down-string devices. The operation of the scan cells is controlled through on-chip Test Access Port (TAP) Controllers and instruction registers. The TAP controller is a state machine that controls operations associated with the boundary scan cells. The basic operation is controlled through four pins: Test Clock (TCK), Test Mode Select (TMS), Test Data In (TDI), and Test Data Out (TDO). The TCK and TMS pins (not shown) direct signals between TAP controller states. The TDI and TDO pins receive the data input and output signals for the scan chain.

According to the present invention, the board level interconnect lines can be tested in the following manner. First, a test pattern xx0x1x0xx is scanned into ASIC 201. Then, an Extest instruction is scanned into ASIC 201. The Extest instruction performs a board level interconnect test. The Extest instruction places an IEEE 1149.1 compliant device into an external boundary test mode and selects the boundary scan register to be connected between TDI and TDO. During this instruction, the boundary scan cells associated with outputs are preloaded with test patterns to test downstream devices. The input boundary cells are set up to capture the input data for later analysis.

After the Extest instruction has been scanned in, a sample instruction is scanned into ASIC 202. Next, a sample instruction is scanned into FPGA 203. The sample instruction allows an IEEE 1149.1 compliant device to remain in its functional mode while selecting the boundary scan register to be connected between the TDI and TDO pins. After the sample instructions have been scanned into chips 202-203, input buffers in FPGA 203 capture the interconnect test signals. Finally, the captured values are scanned out for further analysis.

Further details will now be discussed regarding how an input buffer coupled to an output pin can be enabled to capture a board level test signal according to an embodiment of the present invention. Referring again to FIG. 1, the IO block portion 100 includes an IO pin 106, TTL (transistor transistor logic) input buffer 101, SSTL (stub-series terminated logic) input buffer 102, and an output buffer 108. The inputs of input buffers 101 and 102 are coupled to pin 106. Input buffer 101 drives input signals according to the TTL standard. Input buffer 102 drives input signals according to the SSTL input standard. Two input buffers are shown merely as an example. The IO block can have any number of input buffers. The output of output buffer 108 is coupled to pin 106. Output buffer 108 is coupled to receive data output signals from the chip and drive the data output signals externally through pin 106.

IO block portion 100 also includes weak pull-up logic 109, OR gates 103 and 105, and NOR gates 104 and 107. The first inputs of OR gate 105, OR gate 103, NOR gate 104, NOR gate 107, and weak pull-up logic 109 are coupled to receive a JTAG sample signal $V_S$. A second input of OR gate 105 is coupled to an output of NOR gate 104. A second input of NOR gate 104 is coupled to receive a CRAM bit $V_{SSTL}$. The second input of NOR gate 107 is coupled to receive a CRAM bit $V_{TTL}$. A second input of OR gate 103 is coupled to receive an output enable bar signal $V_{OEB}$. A second input of weak pull-up logic 109 is coupled to receive a weak pull-up enable signal $V_{PU}$.

Buffers 101, 102, and 108 are tristated (i.e., turned off) in response to a high signal at their tristate inputs, and are turned on in response to a low signal at their tristate inputs. The tristate inputs of the input and output buffers are represented as circles in FIG. 1.

Signals $V_S$, $V_{TTL}$, $V_{SSTL}$, and $V_{OEB}$ control the states of buffers 101, 102, and 108 as follows. If $V_S$ is high, input buffer 102 is off. If $V_S$ and CRAM bit $V_{SSTL}$ are both low, input buffer 102 is off. Input buffer 102 is on only when $V_S$ is low and $V_{SSTL}$ is high. Input buffer 101 is on when either $V_S$ or $V_{TTL}$ is high. Input buffer 101 is off when both $V_S$ and $V_{TTL}$ are low. Output buffer 108 is off when either $V_{OEB}$ or $V_S$ is high. Output buffer 108 is on when both $V_{OEB}$ and $V_S$ are low.

Prior to the JTAG sampling phase, the JTAG sample signal $V_S$ is a logic low. When $V_S$ is low, the state of SSTL input buffer 102 is controlled by control RAM (CRAM) signal $V_{SSTL}$, the state of TTL input buffer 101 is controlled by CRAM signal $V_{TTL}$, and the state of output buffer 108 is controlled by output enable signal $V_{OEB}$. CRAM signals $V_{TTL}$ and $V_{SSTL}$ remain low to disable input buffers 101 and 102, because the input buffers are coupled to a programmed output pin 106. When signals $V_{SSTL}$, $V_{TTL}$ and $V_S$ are all low, the outputs of NOR gates 104 and 107 and OR gate 105 are high, causing input buffers 101 and 102 to be off.

During the JTAG sampling phase, a JTAG sample instruction is shifted into the programmable logic IC chip, causing the JTAG sample signal $V_S$ to transition from a logic low '0' to a logic high '1.' When $V_S$ is high, the output of OR gate 105 is forced to remain high, causing SSTL input buffer 102 to remain off regardless of the voltage at $V_{SSTL}$. When $V_S$ is high, the output of NOR gate 107 is forced to a low state, causing TTL input buffer 101 to turn on.

Thus, TTL input buffer 101 is on during the JTAG sampling phase to capture input signals applied to pin 106. Input buffer 101 drives test signals received at pin 106 into a boundary scan register (not shown) for analysis during the JTAG sampling phase. The input buffers coupled to the other pins on the IC are also enabled and forced to become TTL inputs during JTAG sample phase.

The captured signals are then shifted out of the boundary scan registers and analyzed to determine if the board level interconnect is functioning properly. This technique ensures that there is a receiver (e.g., TTL buffer 101) inside the chip that is enabled to capture the test signal at output pin 106 during the test of the board level interconnect.

Alternatively, sample signal $V_S$ can enable SSTL input buffer 102 and disable TTL input buffer 101 during the JTAG sampling phase using slightly different logic gates (e.g., gate 105 becomes a NOR gate and gate 107 becomes an OR gate). In this embodiment, SSTL input buffer 102 captures the test signal on pin 106 and drives the test signal to a boundary scan register. According to the present invention, an external test signal can be captured by an input buffer that drives signals using any IO standard. Capturing test signals at a TTL input buffer 101 is used merely as an example in FIG. 1 to illustrate the principles of the present invention.

When the JTAG sample signal is low before and after the JTAG sampling phase, TTL input buffer 101 is disabled to reduce power consumption for a programmed output pin. Input buffers 101 and 102 are disabled by the CRAM signals during user mode, because pin 106 is configured to function only as an output pin. In other words, buffer 101 is preferably enabled only during the JTAG sampling phase of the boundary scan.

When the sample signal $V_S$ is high during the JTAG sampling phase, output buffer 108 is tristated (i.e., turned off), regardless of the logic state of output enable signal $V_{OEB}$. Output buffer 108 is turned off to prevent contention with the test input signal received at pad 106. Thus, the potential for contention between the driver of ASIC 1 and the receiver of FPGA (output pin 106) is eliminated. Controlling output buffer 108 with sample signal $V_S$ eliminates the extra test time to scan in a logic high signal $V_{OEB}$ to tristate output buffer 108 during the JTAG sampling phase.

Weak pull-up logic circuit 109 is on when either the sample signal $V_S$ or pull-up signal $V_{PU}$ are high. Thus, weak pull-up logic 109 is on during the sampling phase when $V_S$ is high. When weak pull-up logic 109 is on, it enables a weak current path between the supply voltage $V_{DD}$ and pin 106. Referring to FIG. 2, the output buffer coupled to output pin 210 is tristated during the JTAG sampling phase. As a result, the voltage at net 211 is floating, which may cause a short circuit current in an input buffer coupled to input pin 212 in chip 204. Weak pull-up logic 109 prevents the voltage at programmed output pins from floating during JTAG sample phases, because other programmed output pins (such as pin 210) may be driving input buffers in other onboard chips (such as ASIC 204).

There are several important advantages of the present invention. For example, the techniques of the present invention conserve IO power by turning off unused input buffers for programmed output pins, while enabling at least one input buffer long enough to capture an external test signal during a JTAG sampling phase. Also, the techniques of the present invention eliminate conflict between the driver and the receiver by disabling the output buffer during the sampling phase. The present invention also provides a simpler board level test scheme that has a reduced test time. However, IO portion 100 of FIG. 1 requires additional logic gates (the OR and NOR gates) to allow the sample signal to control the input buffers, the output buffer, and the weak pull-up logic.

Figure 3:
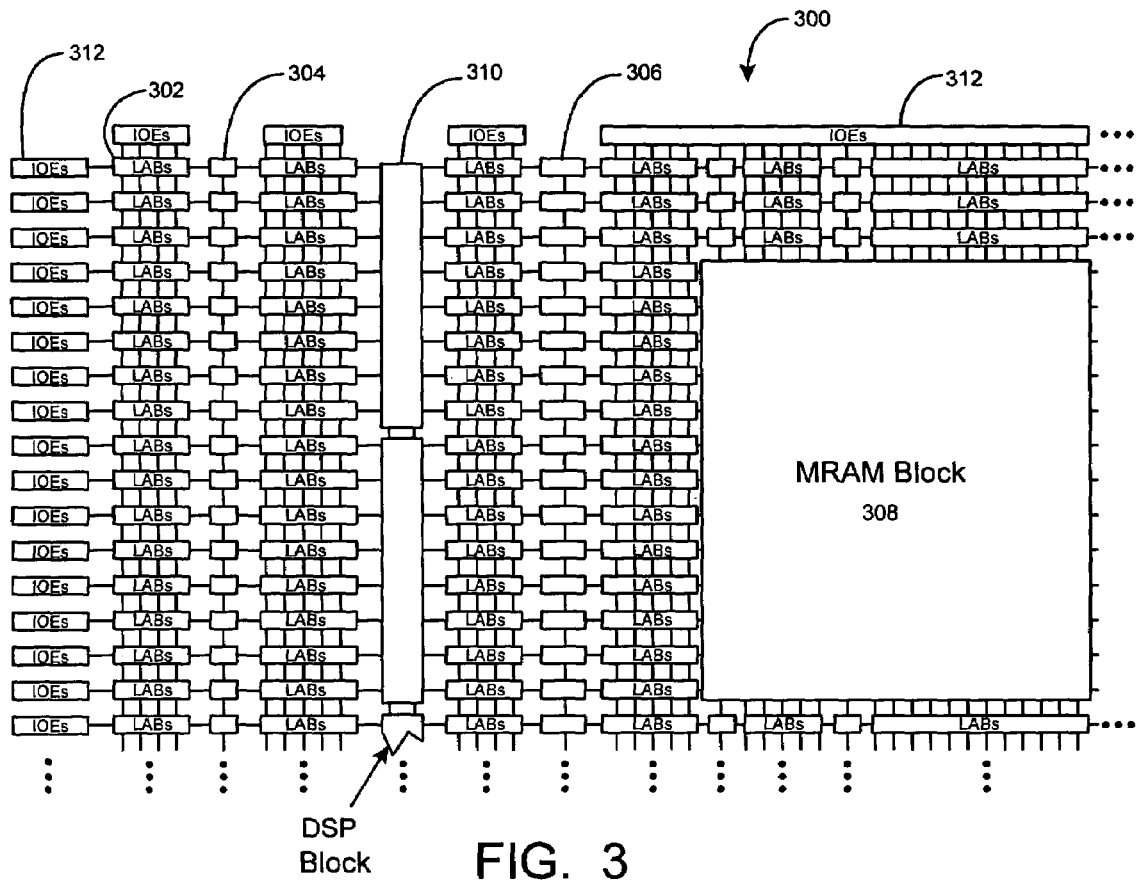
FIG. 3 is a simplified block diagram of a field programmable gate array that can be used with the techniques of the present invention.

FIG. 3 is a simplified partial block diagram of one example of FPGA 300 that can include aspects of the present invention. It should be understood that the present invention can be applied to numerous types of programmable logic integrated circuits such as field programmable gate arrays (FPGAs), programmable logic devices (PLDs), complex programmable logic devices (CPLDs), programmable logic arrays (PLAs), and mask PLDs/FPGAs.

FPGA 300 is an example of a programmable logic integrated circuit in which techniques of the present invention can be implemented. FPGA 300 includes a two-dimensional array of programmable logic array blocks (or LABs) 302 that are interconnected by a network of column and row interconnects of varying length and speed. LABs 302 include multiple (e.g., 10) logic elements (or LEs).

An LE is a programmable logic block that provides for efficient implementation of user defined logic functions. A FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 300 also includes a distributed memory structure including RAM blocks of varying sizes provided throughout the array. The RAM blocks include, for example, 512 bit blocks 304, 4K blocks 306, and a block 308 providing 512K bits of RAM. These memory blocks can also include shift registers and FIFO buffers.

FPGA 300 further includes digital signal processing (DSP) blocks 310 that can implement, for example, multipliers with add or subtract features. I/O elements (IOEs) 312 located, in this example, around the periphery of the device support numerous single-ended and differential I/O standards. It is to be understood that FPGA 300 is described herein for illustrative purposes only and that the present invention can be implemented in many different types of PLDs, FPGAs, and the like.

Figure 4:
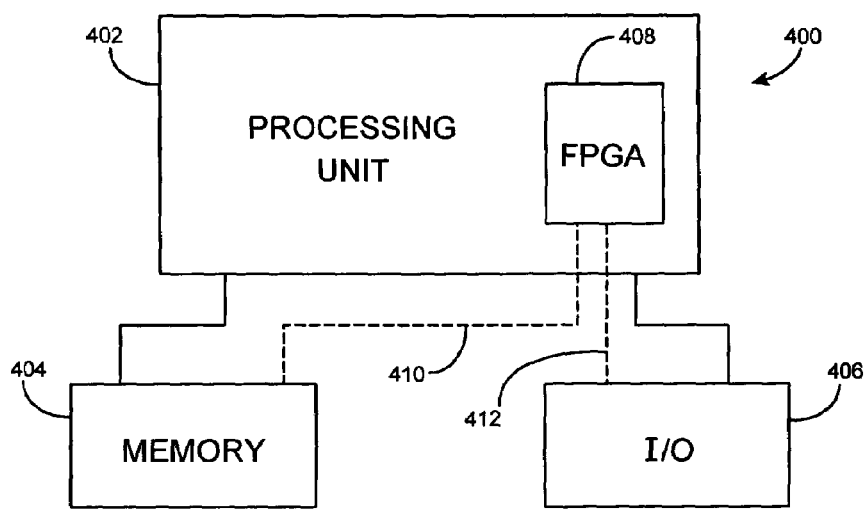
FIG. 4 is a block diagram of an electronic system that can implement embodiments of the present invention.

While FPGAs of the type shown in FIG. 3 provide many of the resources required to implement system level solutions, the present invention can also benefit systems wherein a FPGA is one of several components as described above with respect to FIG. 2. FIG. 4 shows another block diagram of an exemplary digital system 400, within which the present invention can be embodied. System 400 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 400 can be provided on a single board, on multiple boards, or within multiple enclosures.

System 400 includes a processing unit 402, a memory unit 404 and an I/O unit 406 interconnected together by one or more buses. According to this exemplary embodiment, an FPGA 408 is embedded in processing unit 402. FPGA 408 can serve many different purposes within the system in FIG. 4. FPGA 408 can, for example, be a logical building block of processing unit 402, supporting its internal and external operations. FPGA 408 is programmed to implement the logical functions necessary to carry on its particular role in system operation. FPGA 408 can be specially coupled to memory 404 through connection 410 and to I/O unit 406 through connection 412.

Processing unit 402 can direct data to an appropriate system component for processing or storage, execute a program stored in memory 404 or receive and transmit data via I/O unit 406, or other similar function. Processing unit 402 can be a central processing unit (CPU), microprocessor, floating point coprocessor, graphics coprocessor, hardware controller, microcontroller, field programmable gate array programmed for use as a controller, network controller, and the like. Furthermore, in many embodiments, there is often no need for a CPU.

For example, instead of a CPU, one or more FPGAs 408 can control the logical operations of the system. In an embodiment, FPGA 408 acts as a reconfigurable processor, which can be reprogrammed as needed to handle a particular computing task. Alternately, FPGA 408 can itself include an embedded microprocessor. Memory unit 404 can be a random access memory (RAM), read only memory (ROM), fixed or flexible disk media, PC Card flash disk memory, tape, or any other storage means, or any combination of these storage means.

While the present invention has been described herein with reference to particular embodiments thereof, a latitude of modification, various changes, and substitutions are intended in the present invention. In some instances, features of the invention can be employed without a corresponding use of other features, without departing from the scope of the invention as set forth. Therefore, many modifications may be made to adapt a particular configuration or method disclosed, without departing from the essential scope and spirit of the present invention. It is intended that the invention not be limited to the particular embodiments disclosed, but that the invention will include all embodiments and equivalents falling within the scope of the claims.

What is claimed is:

1. A programmable logic integrated circuit (IC) comprising:
   a pin configured to operate only as an output pin during a user mode of the programmable logic integrated circuit;
   an output buffer coupled to the pin;
   a first input buffer coupled to the pin;
   a first logic gate that receives a test instruction and an output enable signal, wherein the first logic gate disables the output buffer in response to the test instruction during a boundary scan test, and the first logic gate enables the output buffer in response to the output enable signal and the test instruction; and
   a second logic gate that receives the test instruction and a first configuration data signal, wherein the second logic gate enables the first input buffer in response to the test instruction during the boundary scan test to capture a board level interconnect test signal applied to the pin, wherein the second logic gate disables the first input buffer in response to the first configuration data signal and the test instruction during the user mode.

2. The programmable logic integrated circuit defined in claim 1 further comprising:
   a second input buffer coupled to the pin; and
   a third logic gate that disables the second input buffer in response to the test instruction during the boundary scan test and disables the second input buffer in response to a second configuration data signal during the user mode.

3. The programmable logic integrated circuit defined in claim 2 wherein the second logic gate is a first NOR gate coupled to a tristate input of the first input buffer, the first logic gate is a first OR gate coupled to a tristate input of the output buffer, and the third logic gate is a second OR gate coupled to a tristate input of the second input buffer.

4. The programmable logic integrated circuit defined in claim 1 further comprising:
   a weak pull-up logic circuit coupled to the pin that provides current from a supply voltage to the pin when the weak pull-up logic circuit is turned on by the test instruction, wherein the weak pull-up logic circuit provides current from the supply voltage to the pin when the weak pull-up logic circuit is turned on by a weak pull-up enable signal.

5. The programmable logic integrated circuit defined in claim 1 wherein the first input buffer is enabled only during the boundary scan test, and wherein the programmable logic integrated circuit is part of a scan chain during the boundary scan test.

6. The programmable logic integrated circuit defined in claim 1 wherein the second logic gate disables the first input buffer before the boundary scan test to reduce power consumption.

7. The programmable logic integrated circuit defined in claim 1 wherein the first input buffer drives the board level interconnect test signal received at the pin into a boundary scan register for analysis.

8. The programmable logic integrated circuit defined in claim 1 further comprising:
   programmable logic blocks having logic elements that are configurable to implement combinatorial and sequential functions;
   a programmable interconnect structure configured to interconnect the programmable logic elements; and
   memory blocks.

9. A method for capturing a board level interconnect test signal, the method comprising:
   configuring a pin in a programmable logic integrated circuit (IC) to function only as an output pin during a user mode of the programmable logic integrated circuit;
   scanning a test instruction into the programmable logic IC during a boundary scan test, wherein the programmable logic IC is coupled to a second IC through board level interconnects;
   enabling a first input buffer using a first logic gate in the programmable logic IC during the boundary scan test in response to the test instruction, wherein the first logic gate receives the test instruction and a first configuration data signal;
   disabling an output buffer using a second logic gate in the programmable logic IC during the boundary scan test in response to the test instruction to prevent contention with the board level interconnect test signal at the pin, the first input buffer and the output buffer being coupled to the pin, wherein the second logic gate receives the test instruction and an output enable signal;
   capturing the board level interconnect test signal from one of the board level interconnects at the pin using the first input buffer during the boundary scan test;
   disabling the first input buffer using the first logic gate after the boundary scan test during the user mode in response to the test instruction and the first configuration data signal; and
   enabling the output buffer using the second logic gate in response to the test instruction and the output enable signal.

10. The method defined in claim 9 further comprising:
    disabling a second input buffer using a third logic gate in the programmable logic IC during the boundary scan test in response to the test instruction, the second input buffer being coupled to the pin.

11. The method defined in claim 10 further comprising:
    disabling the second input buffer using the third logic gate during the user mode in response to a second configuration data signal.

12. The method defined in claim 9 further comprising:
    enabling a weak pull-up logic circuit in the programmable logic IC in response to the test instruction to drive current from a supply voltage to the pin; and
    enabling the weak pull-up logic circuit in response to a weak pull-up enable signal to drive current from the supply voltage to the pin.

13. The method defined in claim 9 further comprising:
    disabling the first input buffer before the boundary scan test using the first logic gate.

14. The method defined in claim 9 wherein the first input buffer is enabled only during the boundary scan test, and the first input buffer drives the board level interconnect test signal received at the pin into a boundary scan register for analysis.

15. A programmable logic integrated circuit comprising:
a pin configured to operate only as an output pin during a user mode of the programmable logic integrated circuit;
an output buffer coupled to the pin;
a first input buffer coupled to the pin;
a first logic gate that receives a test instruction and an output enable signal, wherein the first logic gate disables the output buffer in response to the test instruction during a boundary scan test, wherein the first logic gate enables the output buffer in response to the output enable signal and the test instruction; and
a second logic gate that receives the test instruction and a first configuration data signal, wherein the second logic gate enables the first input buffer in response to the test instruction during the boundary scan test to capture an external board level interconnect test signal applied to the pin, wherein the second logic gate disables the first input buffer in response to the first configuration data signal and the test instruction during the user mode, the first input buffer is enabled only during the boundary scan test, and the programmable logic integrated circuit is part of a scan chain during the boundary scan test.

16. The programmable logic integrated circuit defined in claim 15 further comprising:
a second input buffer coupled to the pin; and
a third logic gate that disables the second input buffer in response to the test instruction during the boundary scan test and disables the second input buffer in response to a second configuration data signal during the user mode.

17. The programmable logic integrated circuit defined in claim 15 further comprising:
a second input buffer coupled to the pin; and
a third logic gate that disables the second input buffer during the boundary scan test in response to the test instruction.

18. The programmable logic integrated circuit defined in claim 15 wherein the first input buffer is a TTL input buffer.

19. The programmable logic integrated circuit defined in claim 15 further comprising:
a weak pull-up circuit that provides a weak current from a supply voltage to the pin when the weak pull-up circuit is turned on by the test instruction, wherein the weak pull-up circuit provides the weak current from the supply voltage to the pin when the weak pull-up circuit is turned on by a weak pull-up enable signal.

20. The programmable logic integrated circuit defined in claim 15 further comprising:
programmable logic blocks having logic elements that are configurable to implement combinatorial and sequential functions; and
a programmable interconnect structure configured to interconnect the programmable logic elements.

* * * * *